United States Patent
Segura Puchades et al.

(10) Patent No.: US 9,817,027 B2
(45) Date of Patent: Nov. 14, 2017

(54) METHOD AND DEVICE FOR COUNTING OBJECTS

(71) Applicants: COMMISSARIAT A L'ENERGIE ATOMIQUE ET AUX ENERGIES ALTERNATIVES, Paris (FR); ISORG, Grenoble (FR)

(72) Inventors: Josep Segura Puchades, Fontaine (FR); Christophe Premont, Sassenage (FR)

(73) Assignees: Commissariat A L'Energie Atomique et aux Energies Alternatives, Paris (FR); Isorg, Grenoble (FR)

( * ) Notice: Subject to any disclaimer, the term of this patent is extended or adjusted under 35 U.S.C. 154(b) by 318 days.

(21) Appl. No.: 14/383,456

(22) PCT Filed: Feb. 21, 2013

(86) PCT No.: PCT/EP2013/053417
§ 371 (c)(1),
(2) Date: Sep. 5, 2014

(87) PCT Pub. No.: WO2013/131750
PCT Pub. Date: Sep. 12, 2013

(65) Prior Publication Data
US 2015/0035516 A1   Feb. 5, 2015

(30) Foreign Application Priority Data
Mar. 6, 2012 (FR) ................................ 12 52025

(51) Int. Cl.
*G01R 1/07* (2006.01)
*G06M 11/00* (2006.01)
*G06M 1/10* (2006.01)

(52) U.S. Cl.
CPC ............. *G01R 1/071* (2013.01); *G06M 1/101* (2013.01); *G06M 11/00* (2013.01)

(58) Field of Classification Search
CPC ........... G01R 1/071; G06M 7/00–7/10; G06M 9/00–9/025; G06M 11/00–11/04; G06M 2207/00–2207/02
See application file for complete search history.

(56) References Cited

U.S. PATENT DOCUMENTS 3,493,772 A * 2/1970 Burzio ............... G01N 15/1468
356/244
4,139,766 A   2/1979 Conway
(Continued)

FOREIGN PATENT DOCUMENTS

FR       2400734 A1   3/1979
JP    2009-031097 A   2/2009

*Primary Examiner* — Huy Q Phan
*Assistant Examiner* — David Frederiksen
(74) *Attorney, Agent, or Firm* — Baker Hostetler LLP

(57) ABSTRACT

In the field of the counting of objects, a use is provided of a photosensitive assembly comprising at least one photodiode or one photoresistor, and a source of uniform illumination for illuminating the assembly, the establishment of a reference current supplied by the photosensitive assembly for an illuminated region of this assembly corresponding to a given fraction of the surface of the assembly, the disposition of objects to be counted against the photosensitive assembly, the illumination of the assembly by the source, the objects masking a part of the surface of the assembly, measurement of the current supplied by the assembly, and determination of a ratio between measured current and reference current to deduce the proportion between the surface area of photosensitive element illuminated and the surface area masked by the objects disposed. From this ratio, information on the number of objects disposed on the photosensitive assembly is extracted.

12 Claims, 8 Drawing Sheets

(56) References Cited

U.S. PATENT DOCUMENTS

| | | | | |
|---|---|---|---|---|
| 4,675,520 | A | * | 6/1987 | Harrsen ................. A01C 7/105 250/221 |
| 5,076,692 | A | * | 12/1991 | Neukermans .......... G01N 21/94 250/574 |
| 5,218,211 | A | * | 6/1993 | Cresswell ............ G01R 31/308 250/559.04 |
| 5,457,312 | A | * | 10/1995 | Mansour ............... G06M 1/101 250/222.2 |
| 5,504,573 | A | * | 4/1996 | Cheiky-Zelina ... G01N 33/2858 250/301 |
| 5,510,246 | A | * | 4/1996 | Morgan ................... C12Q 1/04 377/10 |
| 6,836,527 | B1 | * | 12/2004 | Wooldridge ............. G01V 8/20 250/221 |
| 2005/0242272 | A1 | * | 11/2005 | Lawler .................... G01S 7/486 250/214 R |
| 2006/0045323 | A1 | * | 3/2006 | Ateya ................. G06K 9/2027 382/141 |
| 2007/0076108 | A1 | * | 4/2007 | Misawa ............ H01L 27/14609 348/294 |
| 2008/0151220 | A1 | * | 6/2008 | Hershtik ................ A01K 43/00 356/51 |
| 2015/0247950 | A1 | * | 9/2015 | Perkins ................ G01J 3/0291 250/254 |

\* cited by examiner

METHOD AND DEVICE FOR COUNTING OBJECTS

CROSS-REFERENCE TO RELATED APPLICATIONS

This application is a National Stage of International patent application PCT/EP2013/053417, filed on Feb. 21, 2013, which claims priority to foreign French patent application No. FR 1252025, filed on Mar. 6, 2012, the disclosures of which are incorporated by reference in their entirety.

FIELD OF THE INVENTION

The invention relates to the counting of objects by a direct optical detection method.

BACKGROUND

The detection of objects by optical methods can make use of more or less sophisticated means, notably comprising an image capture with an electronic image sensor and a later complex processing of the image (shape recognition, etc.) in order to carry out a counting of objects present in the image.

SUMMARY OF THE INVENTION

Here, a simpler and more direct method of counting, and a corresponding counting device, are provided for applications such as the counting of objects placed on a surface.

According to the invention, the following are provided
use of a photosensitive assembly comprising at least one photoconducting element, and a source of uniform illumination for illuminating the photosensitive assembly,
determination of a reference current provided by the photosensitive assembly for an illuminated region of this assembly corresponding to an elementary surface area which is a given fraction of the surface area of the photosensitive assembly,
disposing of the objects to be counted against the photosensitive assembly, the illumination of the photosensitive assembly by the source, the objects placed masking a part of the surface of the photosensitive assembly,
measurement of the current supplied by the assembly, and determination of the surface area masked by the objects and, as a consequence, the number of objects, based on the measured current and on the reference current.

The photoconducting element is preferably a photodiode but may be a photoresistor.

The objects that it is desired to count will, in general, be inanimate, but the invention is also applicable to the counting of living bodies such as colonies of bacteria in a Petri dish (container with transparent lid); the word 'object' in the context of this invention will denote both living bodies and inanimate objects.

The invention is particularly usable with a photosensitive assembly composed of a sheet coated with a printed photoconducting organic material and conductors allowing a current due to the illumination to be collected. The sheet is preferably a flexible sheet with small or large dimensions (a sheet of large dimensions is understood to mean a sheet of at least ten centimeters on a side and preferably several tens of centimeters on a side). Such a sheet is placed for example on a plane surface and the objects are placed on the sheet. A plate for diffuse illumination with uniform light is disposed above the sheet. For example, the sheet is placed on the bottom of a drawer and the illuminating plate closes the upper surface of the drawer; or else the sheet is disposed in the bottom of a receptacle or under the receptacle, if it is transparent, and the illuminating plate is disposed above the receptacle or on top of a transparent lid.

In the preferred version of the invention, the photosensitive assembly comprises a matrix of N rows and P columns of photoconducting elements or pixels (N and P are integers greater than or equal to 1). This is a passive matrix composed of a network of row conductors and of column conductors, with a photoconducting element (preferably a photodiode) disposed at each intersection between a row conductor and a column conductor; this element or this photodiode corresponds to a photosensitive pixel. A reference column of the matrix, preferably placed on one edge of the photosensitive matrix, is uniformly illuminated (no object positioned on this column) with the exception of a known number k (k integer or zero) of non-illuminated elementary surfaces. The elementary surface area can be the surface of one pixel. This column is used to determine the reference current corresponding to the illumination of a single elementary surface or pixel; it supplies a current $I_M$ and the reference current corresponding to a single illuminated pixel is $I_M*/(N-k)$. The number k could potentially be equal to 0 (the reference column is totally illuminated). It is however preferred to perform a measurement by difference with two reference columns which are a column having k masked elementary surfaces (k dark pixels) and the other having k' masked elementary surfaces, k' being an integer different from k. The difference in current of the two columns represents k'−k times the reference current of one elementary surface, a fact which allows the elementary current generated by the illumination of a single elementary surface to be determined.

The reference columns may be duplicated (presence of reference columns for example both on the right-hand edge and on the left-hand edge of the matrix) and the currents of two duplicated columns are averaged in order to take into account any non-uniformity in illumination.

The read circuits, associated with each column, are preferably differential, in other words the difference in current is measured between a reference column, for example a totally illuminated column (or totally dark) and the other column, associated with the read circuit, being illuminated but having pixels masked by an object to be counted or, for a reference column, pixels masked by an opaque layer.

A number of objects may be determined column by column, but a global measurement of the current photogenerated by the whole matrix may also be carried out in order to obtain an overall number of objects resting on the matrix.

If the matrix of photodiodes is equipped not only with read circuits in a column but also with read circuits in a row, in other words a read circuit at the end of each row, the read operation can be effected either in a column or in a row and histograms of distribution by row and by column of the pixels masked by objects can be established. For this purpose, it is necessary to be able to power the photodiodes via the row conductors when a measurement is carried out over the columns and via the column conductors when a measurement is carried out over the rows, by reversing the direction of the power supply potentials.

In a simplified version, there is no matrix of photodiodes but only columns of photodiodes, each photodiode, with a very elongated shape, being formed from an entire column of photosensitive material operating as a single photodiode. The read operation can only be carried out in a column, using read circuits associated with the columns, the power being supplied via a single row conductor. The elementary surface area which is used to determine a reference current is then only a fraction of the column.

Finally, in one extremely simplified version, the photosensitive assembly is not subdivided into several photodiodes that can be read individually. It is, on the contrary, composed of a single vast photodiode whose current generated by the illumination is read globally. This assembly can work as long as it is calibrated. The calibration is carried out in two stages: measurement of the current supplied when the totality of the photodiode is illuminated, and measurement of the current when a (or several) known fraction(s) (or elementary surfaces) of the surface (also known) of the photodiode is/are masked. A current measurement may quite simply be performed without any elementary surface area being masked, then a current measurement after having placed one object having the characteristics of the objects to be counted. The elementary surface area is then the surface of the object. The reference current corresponding to the illumination of this surface is determined by difference. Then, the measurement of the current when objects are placed on the surface is carried out.

The invention relates not only to this method of counting and its variants, but also to a corresponding counting device, comprising a passive matrix of N rows and P columns (N and P greater than or equal to 1) of photoconducting elements, notably photodiodes, against which the objects may be placed for masking a part of the matrix, a uniform light source which illuminates the photosensitive assembly, means for determining an elementary current corresponding to the illumination of an elementary surface area which is a fraction of the surface of the matrix, means for measuring at least one current delivered by the matrix in the presence of objects masking a part of the matrix, and calculation means for determining the surface area masked by the objects then the number of objects based on the current delivered and on the elementary current.

BRIEF DESCRIPTION OF THE DRAWINGS

Other features and advantages of the invention will become apparent upon reading the detailed description that follows and which is presented with reference to the appended drawings in which.

DETAILED DESCRIPTION

Figure 1:
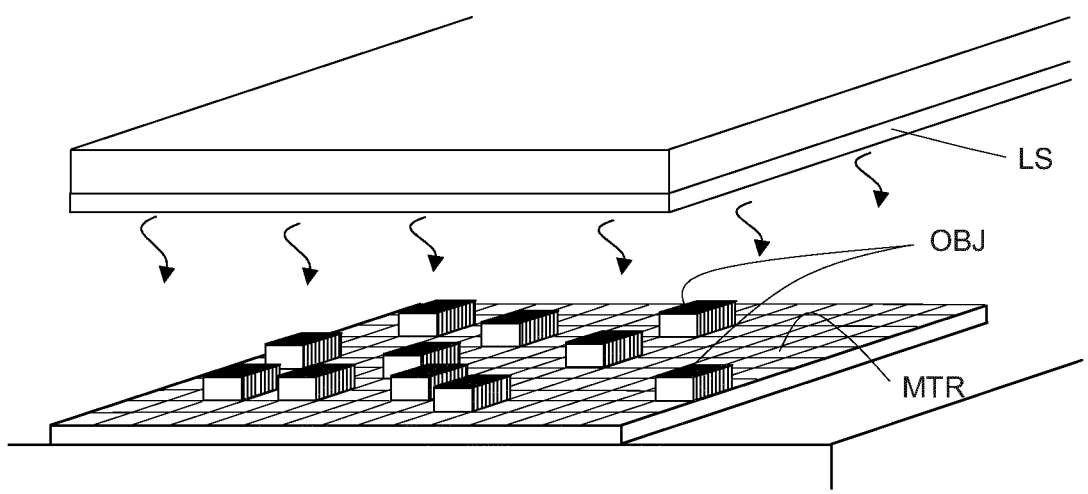
FIG. 1 shows symbolically in perspective a matrix of photosensitive pixels on which objects which mask pixels are placed.

FIG. 1 shows a perspective view of a photosensitive assembly which is symbolized by a matrix MTR of N rows and P columns of pixels, or N×P pixels. The matrix is illuminated uniformly by a light source LS.

Objects OBJ to be counted, all identical, are placed on the matrix. They mask the pixels on which they are resting, in other words the light from the source LS does not reach these pixels. The other pixels are illuminated by the source.

In order to simplify the explanations, the objects are represented as having the shape of a parallelepiped with the same dimensions as the pixels, each object totally covering one and only one complete pixel. It will be seen that this identity of shape and dimensions between the pixel and the object to be counted is not absolutely obligatory, as long as the surface area covered by an object to be counted is known. The surface area of a pixel gives the resolution with which the surface areas of objects placed on the matrix can be detected: the smaller it is, the better small objects can be counted and the more precise is the count of larger objects. The surface area covered by an object can therefore cover several pixels of the matrix.

The light source preferably comprises a diffusing plate similar to the light box of a liquid crystal display. This plate preferably has the same surface area as the matrix.

The photosensitive matrix is a large passive matrix. Typically, it comprises a sandwich structure comprising a substrate sheet preferably made of flexible plastic material, coated with a photoconductor material, preferably organic and deposited by a printing method, between a back face network of conductors and a front face network of conductors. The front face conductors are preferably transparent (made of indium tin oxide ITO) or else must be very narrow so as not to mask the photosensitive material too much; the back face conductors do not need to be transparent. The back face conductors can be row conductors and the front face conductors can be column conductors, or vice versa. If all the row conductors are powered simultaneously by the same potential, they may be combined into a single global conducting layer occupying the major part of the surface area of the sheet.

The conductors are not shown in FIG. 1 so as not to clutter the figure.

A portion of photoconductor material situated at the intersection of a row conductor and a column conductor defines a photosensitive pixel and behaves as a photoresistor, or preferably a photodiode, connected between the row conductor and the column conductor. The row conductor is powered by a bias voltage and the column conductor is connected to a read circuit associated with the column. The read circuit reads the current from each column, in other words the sum of the currents of the photodiodes which are connected to this column conductor and which are furthermore biased by the bias voltage. Each photodiode which is biased by a row conductor indeed allows a current, which depends on the illumination of this photodiode, to flow toward the column conductor.

In the invention, it is not sought to obtain an overall image of the objects placed on the photosensitive sheet; it is only sought to count the objects. Consequently, it is not necessary to successively power the rows one by one in order to observe each time the resulting current on each of the columns. On the contrary, all the rows are globally powered at the same time by the same bias voltage Vpol and the resulting current is read on each column. This current depends on the number of pixels masked in the column by one or more objects.

In the following part, for simplicity, a matrix of photodiodes will be referred to even if the photosensitive material is not truly formed by two semiconducting layers of opposing types, P and N, as is the case in conventional photodiodes. Today, it is known how to form organic elements which behave as photodiodes but which only comprise a single layer of material, PN micro-junctions being established inside the material.

Figure 2:
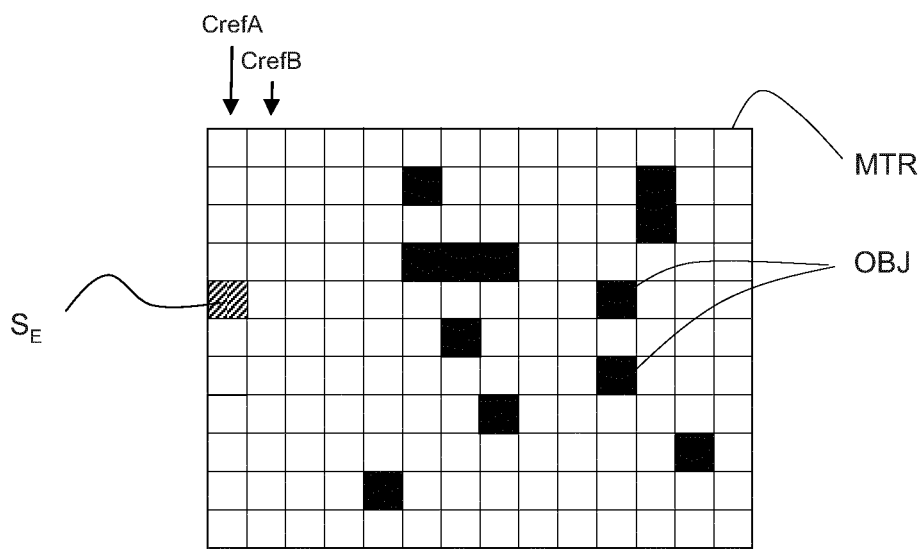
FIG. 2 shows a plan view of such a matrix.

FIG. 2 is a simplified representation, seen from above, of the matrix of pixels in which the white squares represent pixels illuminated by the uniform source and the black squares represent pixels masked by an object covering the pixel and having the same dimensions as the pixel. A shaded square, which will be discussed in more detail hereinbelow, represents a pixel masked by an opaque layer. This square has an elementary surface area $S_E$. It is with respect to this surface area that the surface area of an object placed is defined. Knowing the number of elementary surfaces masked by a single object and by measuring the number of elementary surfaces masked over the matrix, the number of objects placed will be determined.

Figure 3:
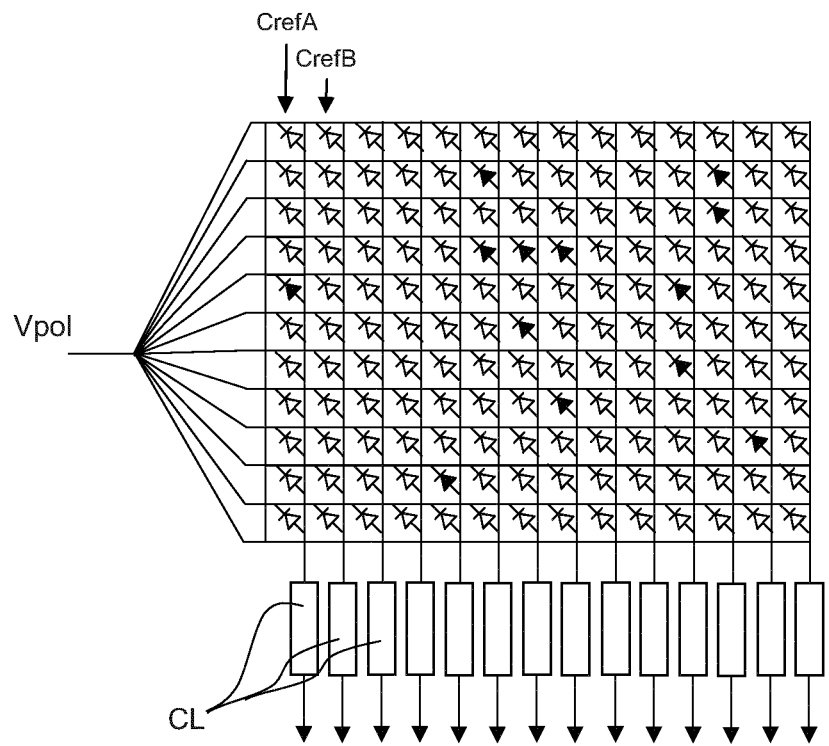
FIG. 3 shows an electrical circuit diagram of a passive matrix of photodiodes and the associated read circuits.

FIG. 3 is a representation of the same matrix, in the form of a passive matrix network of photodiodes in which the cathodes of the photodiodes of the same row are connected to the same row conductor and the anodes of the same column are all connected to the same respective column conductor. Each photodiode at the intersection of a row conductor and a column conductor represents one pixel of the matrix MTR.

The bias voltage Vpol is applied to all the row conductors together, and a more negative potential than the voltage Vpol is applied to the read circuit so as to reverse-bias the photodiodes. The potentials and the orientation of the photodiodes could be reversed, the photodiodes always being reverse-biased so that the current supplied by the photodiode to a column conductor is always a reverse-biasing current for a photodiode, this current depending on the illumination.

The illuminated photodiodes are shown in white. The photodiodes that are not illuminated, since masked by an object, are shown in black.

As can be seen in FIG. 3, there is one read circuit CL per column of pixels; this circuit measures the current supplied by the column conductor, which current is the sum of the currents of the photodiodes in the column.

Generally speaking, the number of objects placed on each column is determined based on a calculation of the number of pixels in a column which are not illuminated by the source owing to the fact that they are masked by an object. This calculation is made by measuring the current $I_M$ produced by the column. The number of illuminated pixels is N−n, when the number of masked pixels is n. If the elementary current $I_E$ produced by an illuminated pixel is known, then the current produced by N−n illuminated pixels is $(N-n)I_E$; the number of masked pixels in the column supplying a current $I_M$ is $n=N-I_M/I_E$. If $n_i$ denotes the number calculated for the column of rank i, the total number of masked pixels in the matrix MTR is the sum $n_T$ of the $n_i$, i varying from 1 to P.

In the simplest case (FIGS. 1 and 2), there are as many objects as there are masked pixels. In the less simple cases (objects disposed partly covering one or more pixels or objects that are smaller or larger than a pixel), an approximation rather than an exact calculation can be made, this approximation being made based on the number $n_T$ and on the ratio between the surface area of an object and the surface area of a pixel.

In a first embodiment of the invention, corresponding to FIGS. 2 and 3, two reference columns of the matrix are used, one (CrefA) having one or more pixels artificially masked, for example by a local opaque layer, the other (CrefB) not having any pixels masked by either an opaque layer or by an object. It is not permitted to deposit an object to be counted over these reference columns. The difference between the current $I_{refB}$ of the column CrefB and the current $I_{refA}$ of the column CrefA represents the average current $I_E$ supplied by a pixel. If k pixels (k>1) are masked in the column CrefA, the difference of the currents of the columns CrefB and CrefA must be divided by k in order to obtain the average current $I_E$.

The number $n_i$ of pixels masked in a column of rank i is obtained by dividing by $I_E$ the difference between the current $I_{refB}$ of the column and the current measured by the read circuit of the column of rank i.

This measurement by difference eliminates the contribution of the dark current of the photodiodes, assuming that this current is more or less uniform for all the photodiodes of the matrix.

The current of the completely illuminated column can be used to determine the mean illumination of the matrix assumed to be uniformly illuminated. It can be used for the purposes of closed-loop control of the light source. It could also be used, if it is divided by the number N of pixels in the column, to determine the average current $I_E$ of one pixel, but it is preferable to determine this current by difference between the currents of the reference columns CrefA and CrefB, in order to eliminate the contribution of the dark current and the drifts over time of the response of the photodiodes and/or of the illumination.

Figure 4:
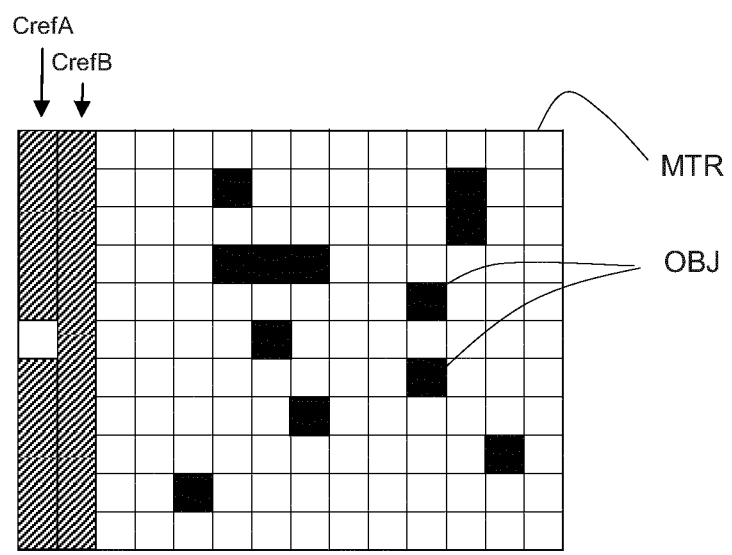
FIG. 4 shows the matrix with reference columns different from those in FIG. 2.

In a second embodiment, shown in FIG. 4, the first reference column CrefA comprises N−1 pixels masked, for example, by an opaque layer deposited on its surface, and a single illuminated pixel; the second reference column CrefB comprises all the N pixels masked by an opaque layer. The difference between the currents of the column CrefA and the column CrefB gives directly the elementary current $I_E$ of one illuminated pixel. The currents of the other columns are divided by $I_E$ in order to obtain the number of illuminated pixels; the complement to N gives the number of masked pixels in the column. There could also be k masked pixels in the column CrefA instead of only one. The difference in currents will need to be divided by k in order to obtain the reference current for one pixel. There could also be k masked pixels in one of the columns and k' masked pixels in the other, the difference in current having to be divided by k' in order to obtain the reference.

Figure 5:
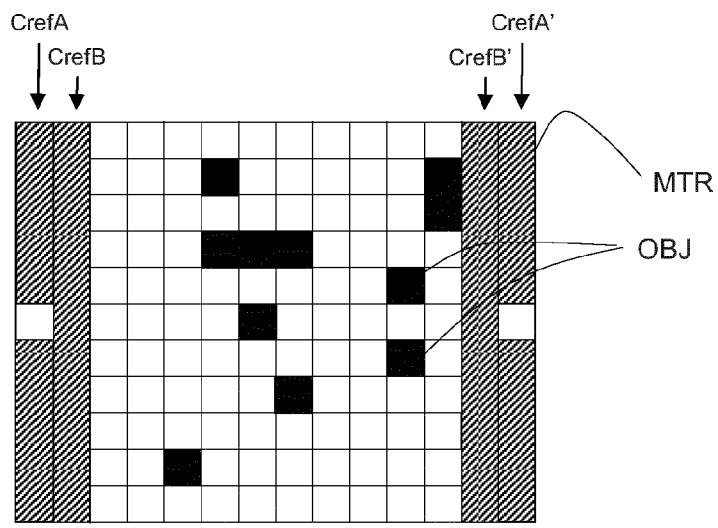
FIG. 5 shows the matrix with the reference duplicated columns n.

In the two preceding embodiments, the effects of a non-uniformity in illumination may be compensated by duplicating the reference columns, for example by placing a pair of reference columns CrefA, CrefB on the left of the matrix, and another pair, CrefA', CrefB', on the right of the matrix as shown in FIG. 5. The results of the two columns are averaged in order to obtain the elementary current $I_E$.

The read circuits are current read circuits, the current delivered by the reverse-biased photodiodes being a good representation of the illumination. However, the currents may be converted into a voltage so as to be more easily convertible by an analog-digital converter (not shown) in order to perform the calculations of number of objects placed.

One particularly advantageous solution for the measurement of the current and the conversion into voltage consists in using the current of one reference column and copying it into the other reference columns so as to apply to each read circuit associated with a column, rather than the current of this column, the difference between the current of this column and the current of the reference column.

Figure 6:
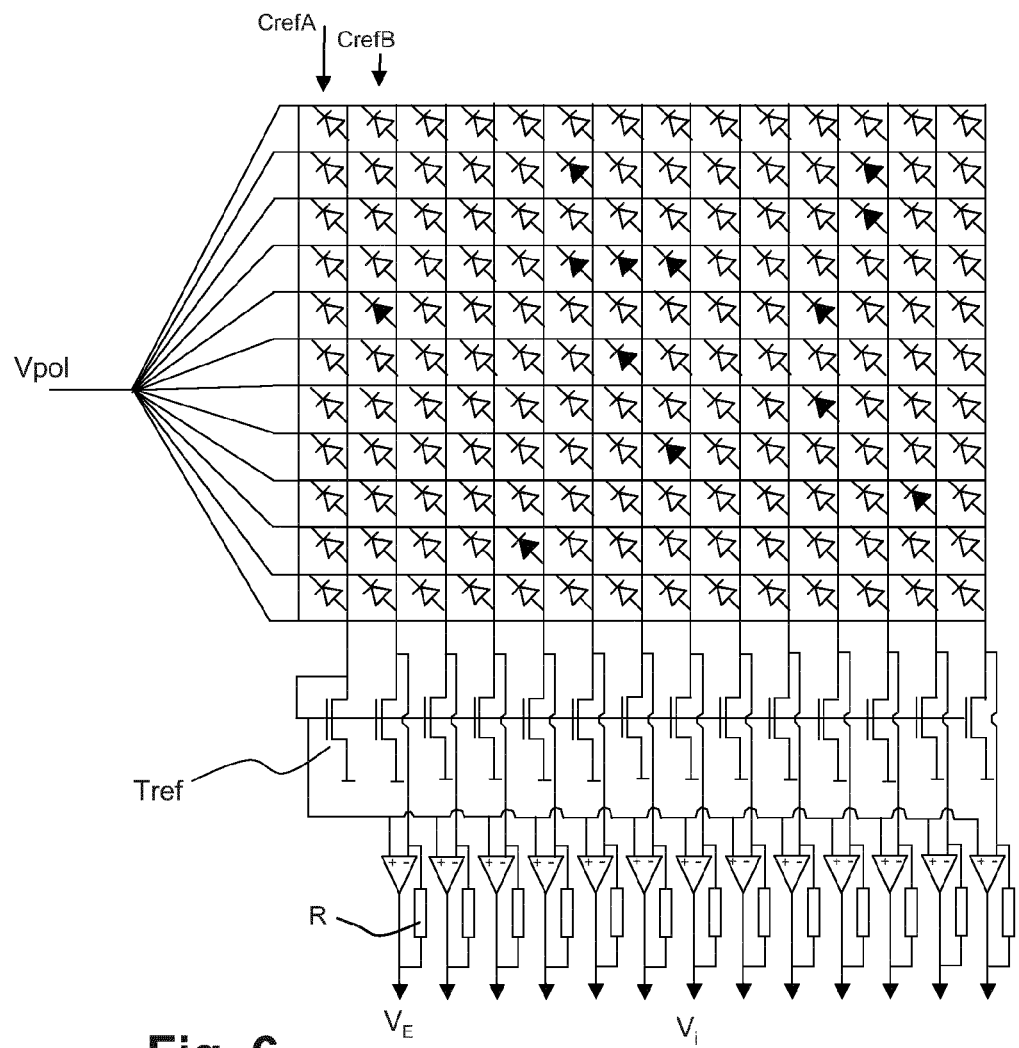
FIG. 6 shows a matrix with read circuits associated with each column of pixels.

FIG. 6 shows such an embodiment, in which the reference column that is used to establish the current to be copied is a column CrefA all the pixels of which are illuminated. The corresponding column conductor is connected to the drain of a reference transistor Tref configured as a diode, whose gate is connected to the drain and whose source is at a ground potential. There is not really any read circuit associated with this column, other than this transistor which receives the totality of the current of the column CrefA. The current in this transistor is equal to $N \cdot I_E$ if the N pixels of the reference column are entirely illuminated. This current is copied by a respective copier transistor for each read circuit associated with a column. For this purpose, the copier transistor has its source connected to ground and its gate connected to the gate of the first transistor. The drain of the copier transistor is not connected to its gate; it is connected to the column conductor corresponding to this read circuit and it is furthermore connected to an inverting input of an operational amplifier. The non-inverting input of the amplifier is connected to the gate of the reference transistor and hence to the gates of the copier transistors. This configuration allows a reliable copying of the current by biasing each drain at the gate voltage of the reference transistor by the negative feedback action of the operational amplifier. The operational amplifier is looped back between its output and its inverting input via a resistor of value R (the same value for all the circuits).

The reference transistor draws a current $N \cdot I_E$ from the reference column conductor, and the copier transistor draws an identical current from the column to which it is connected. However, as the current delivered by the photodiodes of this column is $(N-n_i)I_E$ if there are $n_i$ masked pixels in the column of rank i, the difference between these two currents is evacuated toward the operational amplifier. The current flowing in the feedback resistor is the difference between these two currents, which is $n_i \cdot I_E$. The voltage developed across the terminals of the resistor R of a read circuit is $V_i = R \cdot n_i I_E$. It is proportional to the number $n_i$ of masked pixels in the column.

The amplifier associated with the second reference column CrefB supplies a reference voltage $V_E = R \cdot I_E$. The number $n_i$ is obtained by the ratio of these voltages $V_i$ and $V_E$.

The voltages can be converted by an analog-digital converter (not shown) in order to subsequently allow an easy digital division.

The individual read circuit being used to determine the number of masked pixels in a column is individual for each column. However, for reasons of bulk size, it may be preferred to carry out a time multiplexing of the read operation, by successively directing the currents coming from each column towards a single common circuit for current-voltage conversion comprising, for example, the operational amplifier and the resistor in FIG. 6. The output voltages are then read successively rather than simultaneously.

Figure 7:
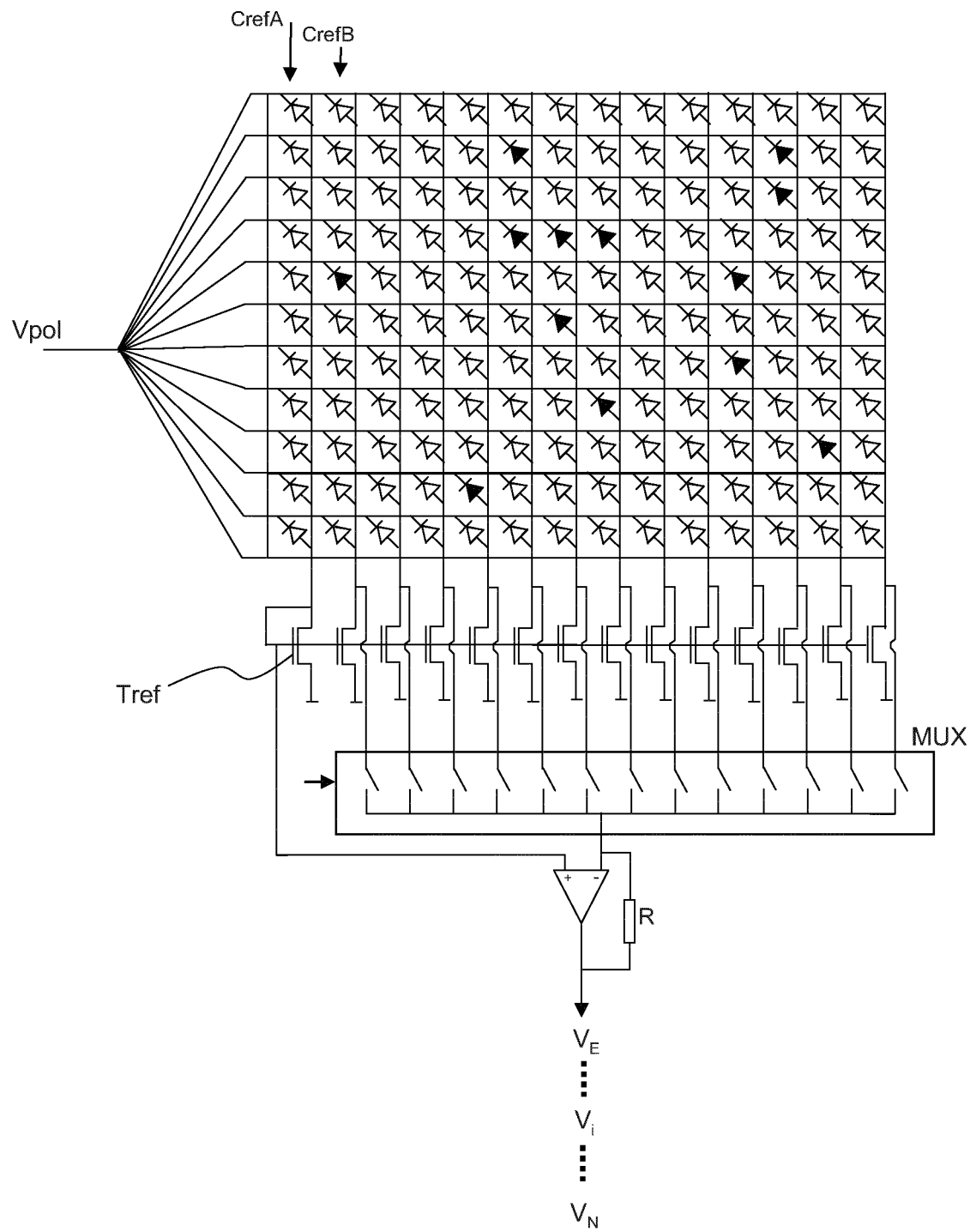
FIG. 7 shows a matrix with a multiplexing of the reading of the columns of pixels.
Figure 8:
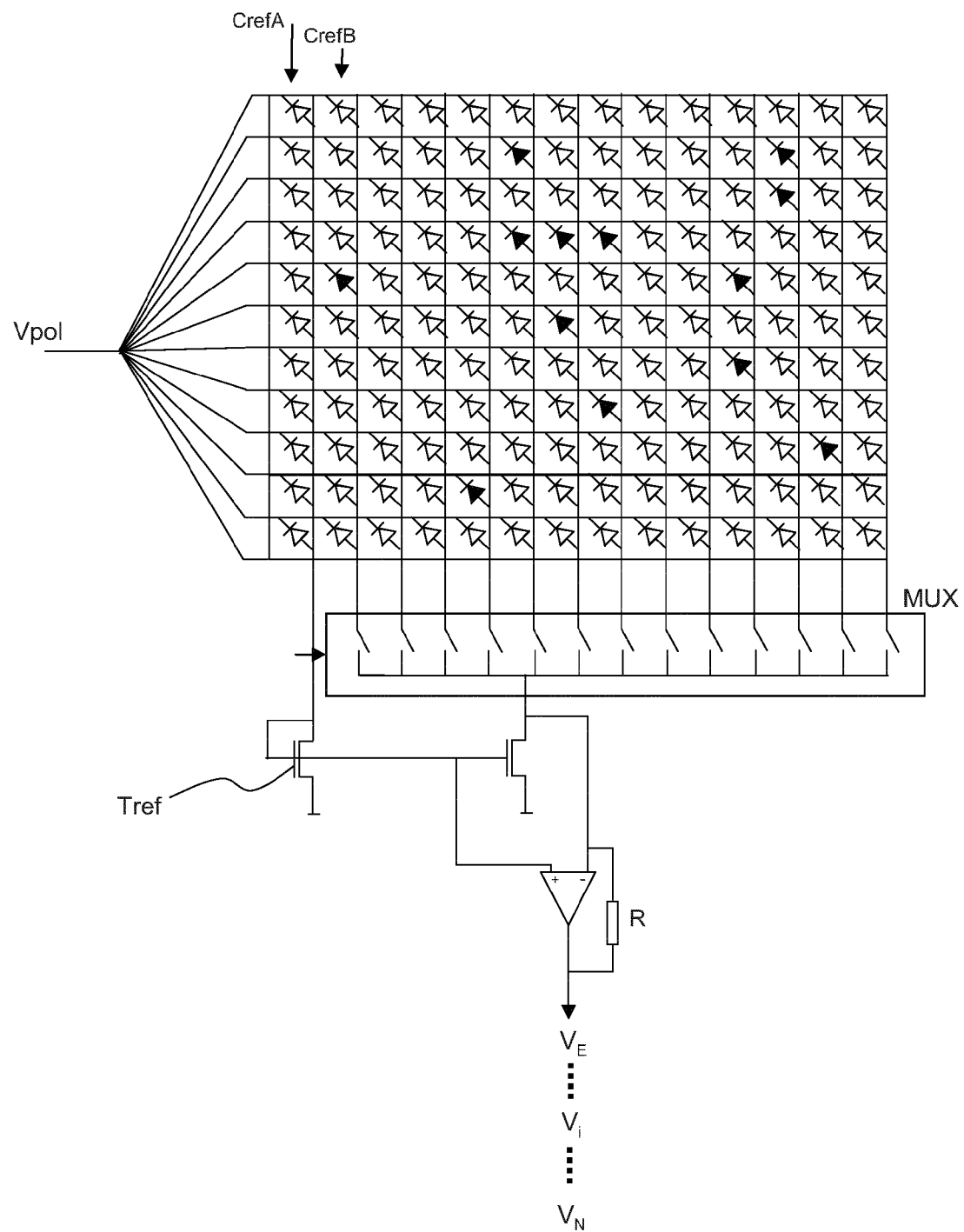
FIG. 8 shows one variant embodiment of FIG. 7.

The multiplexer MUX may be placed downstream of the copier transistors for the N−1 columns other than the column CrefA, as shown in FIG. 7; the read circuit associated with a column then comprises the copier transistor and the routing of the multiplexer, and the amplifier and the resistor are shared between all the read circuits. The multiplexer MUX may also be placed upstream, and in this case there is only one copier transistor, placed between the output of the multiplexer and the input of the amplifier, as is shown in FIG. 8.

A capacitor can be connected in parallel with the feedback resistor of the amplifier in order to filter the transients during the switching of the multiplexer.

In place of a system for copying current, the column conductors could be directly connected to a multiplexer. The multiplexer successively selects each column under the control of a simple shift register, and it then directs this current, and this alone, toward a single read circuit. The first reference column is firstly selected, then the second; the reference current is calculated by difference. Then, the other columns are selected one after the other for a direct measurement of their current.

Generation of Histograms in a Column

Figure 9:
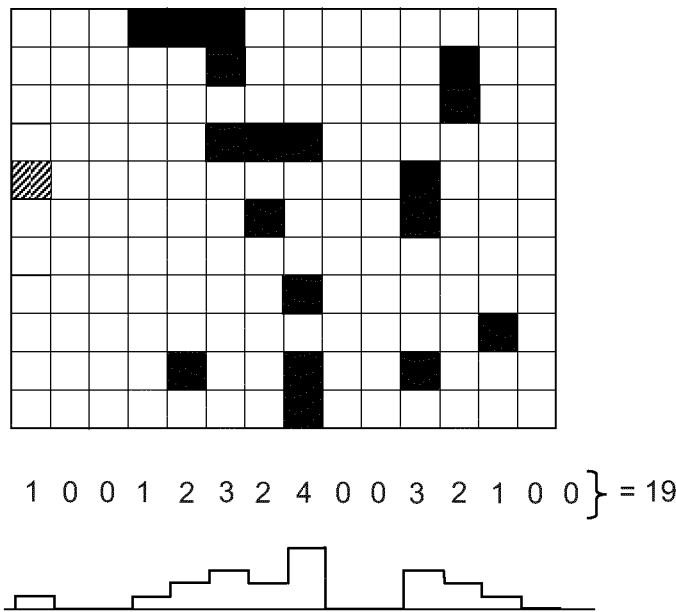
FIG. 9 shows a diagram explaining a calculation of a histogram in a column.

The principle described previously allows the number of objects placed in each column of the matrix to be determined. A histogram by column can therefore be traced, in other words a curve whose abscissa is the number of the column and whose ordinate is the number of objects placed in the column. FIG. 9 shows schematically the result of this histogram calculation.

However, if only the total number of the objects placed on the matrix is of interest, all the columns may be read simultaneously in order to measure the total current generated by the photodiodes. In this case, after having determined the elementary current generated by one illuminated pixel, all the columns can be connected together (all the switches of the multiplexer being activated at the same time) to the read amplifier, the output voltage be measured and the total number of masked pixels hence of objects placed be deduced from this; it should be noted that a non-illuminated pixel comes from the shaded pixel of the reference column CrefB in FIGS. 6 to 8 and not from an object placed.

Generation of Histograms in a Column and in a Row

If it is desired to determine the number of pixels in a row, the roles of the rows and of the columns need to be able to be reversed. This means that read circuits connected to the ends of the rows, and not only to the ends of the columns, need to be provided means for applying a reversed bias voltage −Vpol on the columns, in place of the bias voltage Vpol on the rows, need to be provided the read circuits of the rows need to be adapted to a general inversion of the voltages and of the currents with respect to those that are used for the column read operation.

Figure 10:
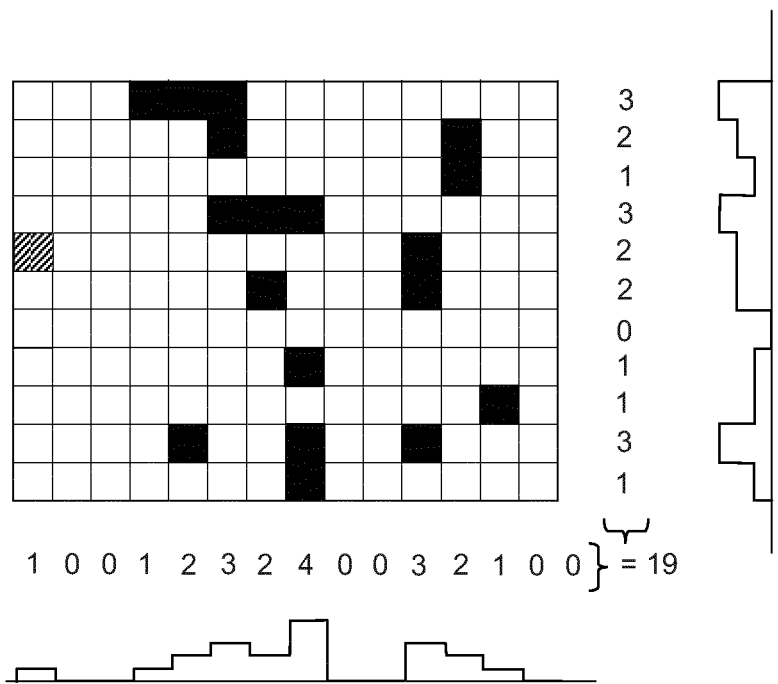
FIG. 10 shows a diagram explaining a histogram in a column and in a row.

If this is the case, a histogram in a column and a histogram in a row can be generated by calculation. FIG. 10 shows schematically these row and column histograms.

Photodiodes Decomposed into Columns but not into Rows

If there is only one row of photodiodes and if each photodiode is elongated over the entire height of the photosensitive sheet, the counting of objects can still be carried out.

The elementary surface area, which defines the resolution of the measurement, is equal to the width of the column multiplied by a fraction of the height of the column. The reference column CrefB, which will be used to determine the elementary current, must therefore be masked over this fraction of surface area of column, as is indicated by the shaded surface in FIG. 11. The other reference column CrefA is completely illuminated and no object is resting on it.

In order to count the number of objects placed, exactly the same measurement as in the preceding cases is carried out: the elementary current $I_E$ which would be generated by the shaded fraction alone if it were illuminated is determined by difference between the measurements from the reference columns. This fraction preferably corresponds to the surface area of an object to be detected, as in the case of the preceding figures. Then, globally or column by column, the currents generated in the presence of the objects placed are measured and they are compared with the reference current in order to calculate, column by column or globally, the number of masked elementary surfaces. The difference with respect to the preceding figures is only the fact that the photodiodes are not subdivided into several pixels in the direction of the height.

A column histogram remains possible, but not a row histogram as there is now only one row.

Use of a Single Large Photodiode

It may even be envisioned for there to be no decomposition of the photosensitive sheet into elementary photodiodes addressable in rows and in columns.

In this case, a prior calibration must be carried out in order to determine the elementary current corresponding to an illuminated surface which is equal to the elementary surface area of an object to be counted (or a smaller surface area if a better resolution is desired in the counting).

Consequently, a first measurement is carried out by illuminating the whole photodiode; then, a second measurement by masking one elementary surface area. The current $I_E$ generated by the illumination of this elementary surface area is deduced by difference. Then, the objects are placed and the overall current delivered by the photodiode is measured. Using a division by $I_E$, the number of masked elementary surfaces, hence the number of objects, are deduced from this.

Figure 12:
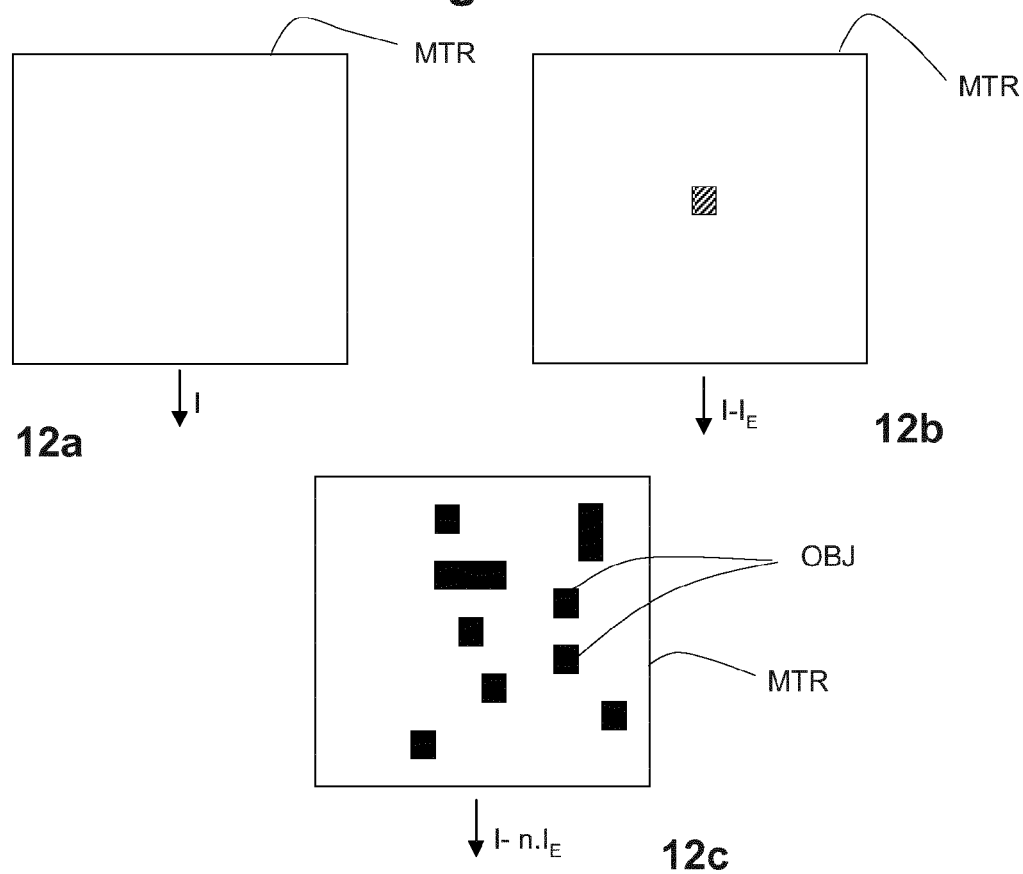
FIG. 12 shows the photosensitive assembly formed by a single large photodiode, with two calibration steps (12a, 12b) and a measurement step (12c)

FIG. 12 represents the three steps of this measurement. The first step (12a) gives a measurement of current I when the entirety of the photodiode is illuminated; the second step (12b) is effected by masking an elementary surface area which can be situated anywhere in the photodiode, here for example in the center; this gives a current $I-I_E$; the third step (12c) gives a current $I-n \cdot I_E$, n being the number of objects to be counted, expressed as a multiple of the elementary surface area masked in the second step. The difference between the first step and the second is calculated so as to obtain $I_E$, and the difference between the first step and the third so as to obtain $n \cdot I_E$. The ratio gives the total number of masked elementary surface areas, from which the number of objects placed can be deduced.

Objects not Coinciding with the Network of Photodiodes

Figure 11:
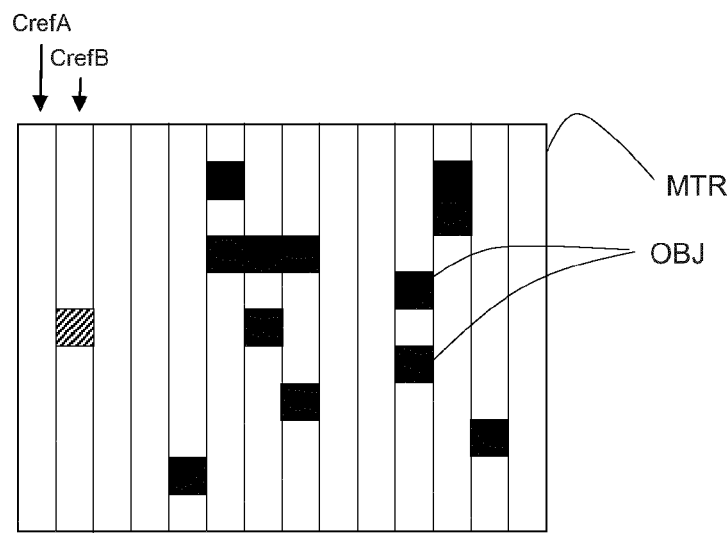
FIG. 11 shows a matrix whose columns are not subdivided into individual pixels.
Figure 13:
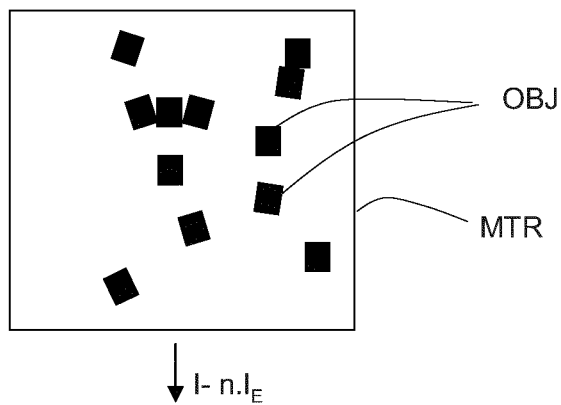
FIG. 13 and FIG. 14 show the photosensitive assembly with objects which are not placed precisely on the pixels of the matrix.

FIG. 13 shows the case of a single large photodiode, on which the objects are placed without paying attention to their position; it is clear that the objects can still be counted: there is no change with respect to FIG. 11 which showed the objects placed according to a precise matrix organization.

Figure 14:
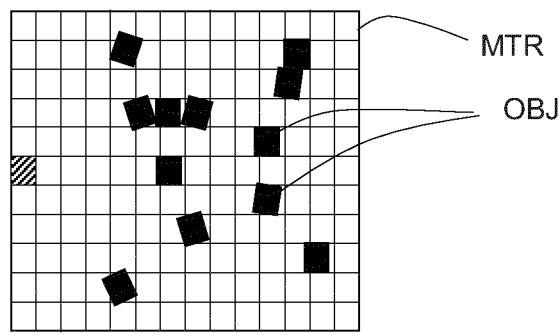

However, even if the photodiode is decomposed into columns and rows, the objects badly positioned with respect to the network, in other words objects which might be straddling two rows and/or two columns, can be counted, the only thing being that the counting of the objects in a row and in a column would be less precise. For each column, values of the number $n_i$ will be obtained which do not have to be integers but rather fractional; these fractional values will be summed in order to obtain the best possible integer approximation for the total number of objects placed on the matrix. FIG. 14 shows a matrix on which the objects are rotated or offset with respect to the columns of pixels (and potentially to the rows, but the rows are not important if the read operation is performed by column).

Resolution

In order to obtain a desired resolution, in other words a capacity for small objects to be counted for a given surface area of the photosensitive sheet, the surface of the sheet has to be decomposed into elementary surfaces that are sufficiently small. However, the limit is given by the noise: the total noise, conventional mean square sum of the thermal noise, of the "shot" noise (also known as Schottky or photon noise) and of the 1/f noise must remain below the current generated by the illumination of one elementary surface by the light source LS.

Similarly, the spatial dispersion of the characteristics of the photodiodes must not lead to variations in current greater than the elementary current $I_E$, or the matrix must then be calibrated in order to subtract any potential dispersions.

By way of example, a matrix of 380 columns and 320 rows, having pixels of 1 mm×1 mm, may be used.

In the preceding description, it has been considered that the measurement of the current generated by the photodiodes is carried out by conversion into voltage in an amplifier with a resistive transimpedance. One drawback is that it may be necessary to switch between values of the resistors as a function of the illumination in order to ensure an adaptation according to the illumination.

An integrating amplifier (amplifier with capacitive transimpedance) may alternatively be used which has the advantage of better regulating the dynamic parameters of the photodiodes, but has the drawback of slowing down the read operation or of requiring large integration capacitors. This drawback is, in part, compensated if working under lower level illumination conditions hence with lower currents. Several read values of the matrix may be averaged in order to attenuate the noise.

The invention claimed is:

1. A method for counting objects, comprising:
   illuminating a photosensitive assembly comprising at least one photoconducting element, by a source of uniform illumination;
   determining a reference current that is supplied by an illuminated region of the photosensitive assembly, wherein said illuminated region has an elementary surface area which is a given fraction of a surface area of the photosensitive assembly;
   placing objects to be counted against the photosensitive assembly, and illuminating the photosensitive assembly with said source, the objects masking a part of the surface of the photosensitive assembly;
   measuring a current supplied by the illuminated surface of the photosensitive assembly masked by the objects to be counted; and
   determining a count of objects based on the measured current and on the reference current,
   wherein the photosensitive assembly comprises a passive matrix of N rows and P columns of photoconducting elements, N and P being integers each greater than or equal to 1, each situated at an intersection between a row conductor and a column conductor of the passive matrix, wherein the passive matrix comprises at least one reference column having a known number k of non-illuminated elementary surfaces, k being an integer or zero, said reference column being used to determine the reference current corresponding to an illumination of a single elementary surface area, and wherein the passive matrix comprises at least one other reference column comprising k' non-illuminated elementary surfaces, k' being different from k, and the difference in the currents of the two reference columns is measured so as to deduce from this the current generated by the illumination of a single elementary surface area.

2. The method as claimed in claim 1, wherein the photosensitive assembly comprises a flexible sheet coated with a printed photoconducting organic material and of conductors allowing a current due to the illumination to be collected.

3. The method as claimed in claim 1, wherein the reference column is duplicated and the currents supplied by the duplicated columns are averaged.

4. The method as claimed in claim 1, wherein a read circuit is associated with each column, and this circuit is differential, said read circuit measuring the difference between a current supplied by a reference column all the pixels of which are illuminated or a current supplied by a reference column all the pixels of which are masked and a current supplied by the column associated with the read circuit.

5. The method as claimed in claim 4, wherein the passive matrix comprises a single row of photoconducting elements each having an elongated shape, said elementary surface area representing a fraction of a height of a photoconducting element.

6. The method as claimed in claim 1, wherein read circuits are associated with each column as well as with each row of a matrix formed by the photosensitive assembly.

7. The method as claimed in claim 1, wherein the photosensitive assembly is not subdivided into several photoconducting elements that can be read individually, but it is formed by a single photoconducting element whose current, generated by the illumination, is read globally.

8. The method as claimed in claim 1, wherein the photoconducting elements are photodiodes.

9. The method as claimed in claim 1, wherein the reference column is duplicated and the currents supplied by the duplicated columns are averaged.

10. The method as claimed in claim 1, wherein the reference column is duplicated and the currents supplied by the duplicated columns are averaged.

11. The method as claimed in claim 1, wherein the reference column is duplicated and the currents supplied by the duplicated columns are averaged.

12. A device for counting objects, comprising:
a passive matrix of N rows and P columns of photoconducting elements, N and P being integer numbers greater than or equal to 1, against which the objects are placeable to mask a part of the passive matrix;
a uniform light source which illuminates the whole of the passive matrix;
measuring means for determining an elementary current corresponding to an illumination of an elementary surface area which is a fraction of a surface area of the passive matrix;
means for measuring at least one current delivered by the matrix in the presence of objects masking the part of the passive matrix; and
calculation means for determining a number of objects based on said measured current and the elementary current,
wherein a read circuit is associated with each column of the passive matrix, said read circuit being differential, said read circuit measuring a difference between a current supplied by a reference column all the pixels of which are illuminated or a current supplied by a reference column all the pixels of which are masked and a current supplied by the column associated with the read circuit.

* * * * *